United States Patent
Kwon et al.

(10) Patent No.: US 10,181,346 B2
(45) Date of Patent: Jan. 15, 2019

(54) SEMICONDUCTOR DEVICES AND OPERATIONS THEREOF

(71) Applicant: SK hynix Inc., Icheon-si Gyeonggi-do (KR)

(72) Inventors: Ki Hun Kwon, Seoul (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/622,507

(22) Filed: Jun. 14, 2017

(65) Prior Publication Data

US 2018/0040363 A1 Feb. 8, 2018

(30) Foreign Application Priority Data

Aug. 2, 2016 (KR) .................. 10-2016-0098425
May 19, 2017 (KR) .................. 10-2017-0062009

(51) Int. Cl.
| | |
|---|---|
| G11C 11/4074 | (2006.01) |
| G11C 11/406 | (2006.01) |
| G11C 11/4076 | (2006.01) |
| G11C 11/4093 | (2006.01) |
| G11C 7/22 | (2006.01) |
| G11C 29/02 | (2006.01) |

(52) U.S. Cl.
CPC ............ *G11C 11/4074* (2013.01); *G11C 7/22* (2013.01); *G11C 11/406* (2013.01); *G11C 11/4076* (2013.01); *G11C 11/4093* (2013.01); *G11C 29/023* (2013.01); *G11C 2207/2227* (2013.01); *G11C 2211/4067* (2013.01)

(58) Field of Classification Search
None
See application file for complete search history.

(56) References Cited

U.S. PATENT DOCUMENTS

| | | | |
|---|---|---|---|
| 2006/0245287 A1 | 11/2006 | Seitz et al. | |
| 2010/0208534 A1 | 8/2010 | Fujisawa | |
| 2013/0028038 A1* | 1/2013 | Fujisawa | G11C 7/222 365/222 |

FOREIGN PATENT DOCUMENTS

| | | |
|---|---|---|
| KR | 101065336 B1 | 9/2011 |
| KR | 20150095494 A | 8/2015 |

* cited by examiner

*Primary Examiner* — James G Norman
(74) *Attorney, Agent, or Firm* — William Park & Associates Ltd.

(57) ABSTRACT

A semiconductor device may be provided. The semiconductor device may include a power-down signal generation circuit and a refresh signal generation circuit. The power-down signal generation circuit may be configured to generate a power-down signal which is enabled during a power-down operation period based on a multi-operation signal that is generated by decoding commands. The refresh signal generation circuit may be configured to generate a refresh signal which is enabled during a refresh operation period based on the multi-operation signal and an operation selection signal.

20 Claims, 11 Drawing Sheets

| OPERATION | CS | CMD<1> | CMD<2> | CMD<3> | CMD<4> | CMD<5> | TLCA |
|---|---|---|---|---|---|---|---|
| POWER DOWN ENTRY | L | H | L | H | H | H | L |
| | L | H | H | H | H | H | |
| POWER DOWN EXIT | H | H | H | H | H | H | L |
| | L | | | | | | |

FIG. 3

| OPERATION | CS | CMD<1> | CMD<2> | CMD<3> | CMD<4> | CMD<5> | TLCA |
|---|---|---|---|---|---|---|---|
| SELF REFRESH ENTRY | L | H | L | H | H | H | H |
| | L | | | | | | |
| SELF REFRESH EXIT | H | H | H | H | H | H | H |
| | L | | | | | | |

SEMICONDUCTOR DEVICES AND OPERATIONS THEREOF

CROSS-REFERENCE TO RELATED APPLICATIONS

The present application claims priority under 35 U.S.C 119(a) to Korean Application No. 10-2016-0098425, filed on Aug. 2, 2016 and Korean Application No. 10-2017-0062099, filed on May 19, 2017, which are incorporated herein by reference in its entirety.

BACKGROUND

1. Technical Field

Embodiments of the present disclosure may generally relate to semiconductor devices configured for performing a power-down operation and a refresh operation.

2. Related Art

Semiconductor devices, for example, dynamic random access memory (DRAM) devices may be designed to operate at a high speed with low power consumption and have large cell capacitance. Thus, most semiconductor devices may be designed to have a power-down mode for minimizing a driving current when data is not accessed. If the semiconductor devices are in the power-down mode, the semiconductor devices may terminate generation of internal voltages for driving internal circuits of the semiconductor devices. The semiconductor devices may enter the power-down mode in response to a clock enablement signal (CKE) outputted from an external chip set device. The clock enablement signal (CKE) is a signal that transmits a clock signal for performing an input/output (I/O) operation of data to a memory area of the semiconductor device.

DRAM devices among the semiconductor devices may lose data stored in their memory cells as time elapses even while their power supplies are applied thereto. This is in contrast to static random access memory (SRAM) devices or flash memory devices. In order to prevent the data stored in the DRAM cells from being lost, the DRAM devices may be basically accompanied with an operation for rewriting the data from external systems in a certain period, which is called "a refresh operation".

SUMMARY

According to an embodiment, a semiconductor device may be provided. The semiconductor device may include a power-down signal generation circuit and a refresh signal generation circuit. The power-down signal generation circuit may be configured to generate a power-down signal which is enabled during a power-down operation period based on a multi-operation signal that is generated by decoding commands. The refresh signal generation circuit may be configured to generate a refresh signal which is enabled during a refresh operation period based on the multi-operation signal and an operation selection signal.

According to an embodiment, a semiconductor device may be provided. The semiconductor device may include an operation signal generation circuit and a termination signal generation circuit. The operation signal generation circuit may be configured to generate a power-down signal which is enabled during a power-down operation period and a refresh signal which is enabled during a refresh operation period, based on a multi-operation signal and an operation selection signal. The multi-operation signal may be generated by decoding commands based on a chip selection signal. The termination signal generation circuit may be configured to generate a termination signal which is enabled based on the refresh signal and a refresh control signal.

According to an embodiment, a semiconductor device may be provided. The semiconductor device may include an operation signal generation circuit configured to generate a power-down signal for performing a power-down operation and generate a refresh signal for performing a refresh operation according to a multi-operation signal and an operation selection signal, the multi-operation signal and the operation selection signal generated from commands absent an external signal for controlling the power-down operation and the refresh operation. Wherein the multi-operation signal and the operation selection signal are generated from the commands absent a clock enablement signal. Wherein the clock enablement signal is a signal for transmitting a clock signal for performing an input and output operation of data to a memory circuit.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor device configured for performing a power-down operation and a refresh operation.

Figure 1:
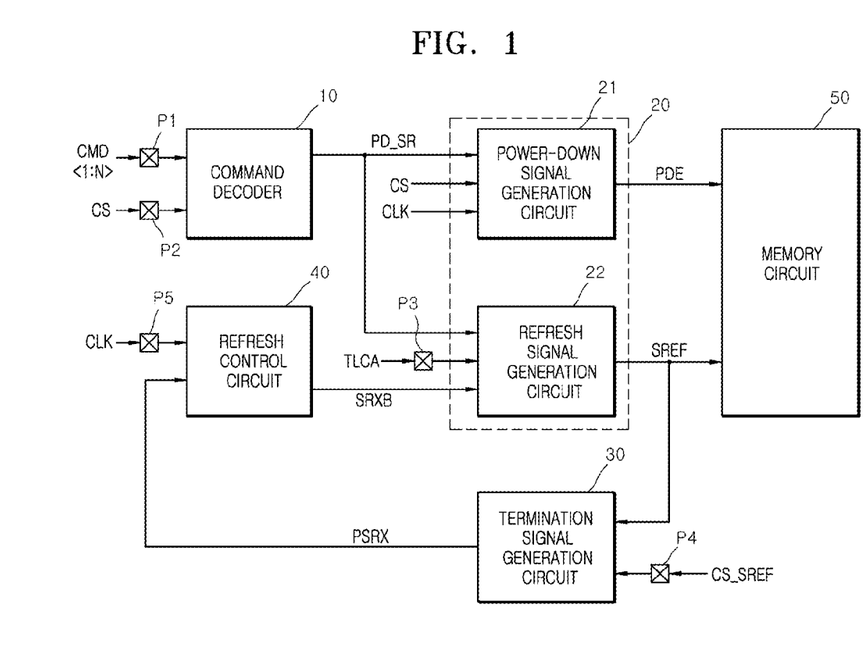
FIG. 1 is a block diagram illustrating an example of a representation of a configuration of a semiconductor device according to an embodiment.

Referring to FIG. 1, a semiconductor device according to an embodiment may include a command decoder 10, an operation signal generation circuit 20, a termination signal generation circuit 30, a refresh control circuit 40 and a memory circuit 50.

The command decoder 10 may decode commands CMD<1:N> to generate a multi-operation signal PD_SR in response to a chip selection signal CS. The commands CMD<1:N> may be inputted to the command decoder 10 through a pad P1. The commands CMD<1:N> may be transmitted from an external device such as a chip set device controlling the semiconductor device to the command decoder 10. The commands CMD<1:N> may be successively inputted to the command decoder 10 through a single line that transmits commands, addresses and data. The chip selection signal CS may be inputted to the command decoder 10 through a pad P2. The number "N" of bits of the commands CMD<1:N> may be set to be a natural number and may be set to be different according to the embodiments.

The operation signal generation circuit 20 may include a power-down signal generation circuit 21 and a refresh signal generation circuit 22.

The power-down signal generation circuit 21 may generate a power-down signal PDE in response to the multi-operation signal PD_SR. The power-down signal generation circuit 21 may generate the power-down signal PDE which is enabled if the multi-operation signal PD_SR is enabled. The power-down signal generation circuit 21 may generate the power-down signal PDE which is enabled during a power-down operation period from a point of time that the multi-operation signal PD_SR is enabled. The power-down signal generation circuit 21 may generate the power-down signal PDE which is enabled from a point of time that the multi-operation signal PD_SR is enabled till a point of time that the chip selection signal CS is delayed by a first set period in synchronization with a clock signal CLK. In some embodiments, the power-down signal PDE may be enabled after the multi-operation signal PD_SR is enabled. The power-down operation period may be set to correspond to a period in which the chip selection signal CS is delayed by the first set period in synchronization with a clock signal CLK. That is, the power-down operation period may correspond to the first set period.

The refresh signal generation circuit 22 may generate a refresh signal SREF which is enabled during a refresh operation period in response to the multi-operation signal PD_SR and an operation selection signal TLCA. The refresh signal generation circuit 22 may generate the refresh signal SREF which is enabled if the multi-operation signal PD_SR is enabled and the operation selection signal TLCA is inputted. The refresh signal generation circuit 22 may generate the refresh signal SREF which is enabled during a second set period from a point of time that the multi-operation signal PD_SR is enabled and the operation selection signal TLCA is inputted. The refresh signal generation circuit 22 may generate the refresh signal SREF which is enabled during the refresh operation period from a point of time that the multi-operation signal PD_SR is enabled and the operation selection signal TLCA is inputted. The operation selection signal TLCA may be inputted through a pad P3 to which the commands CMD<1:N> are applied and may be a signal for performing a refresh operation. In some embodiments, the refresh signal SREF may be enabled after the multi-operation signal PD_SR is enabled. The refresh operation period may be set to correspond to the second set period in which refresh operations of all of memory cells included in the memory circuit 50 are performed.

As described above, the operation signal generation circuit 20 may generate the power-down signal PDE which is enabled during the power-down operation period and the refresh signal SREF which is enabled during the refresh operation period, in response to the multi-operation signal PD_SR and the operation selection signal TLCA.

The termination signal generation circuit 30 may generate a termination signal PSRX which is enabled in response to the refresh signal SREF and a refresh control signal CS_SREF. The termination signal generation circuit 30 may generate the termination signal PSRX which is disabled in response to the refresh signal SREF and may generate the termination signal PSRX which is enabled in response to the refresh control signal CS_SREF. The refresh control signal CS_SREF may be inputted to the termination signal generation circuit 30 through a pad P4.

The refresh control circuit 40 may generate a refresh termination signal SRXB which is enabled in response to the clock signal CLK and the termination signal PSRX. The refresh control circuit 40 may generate the refresh termination signal SRXB which is enabled if the termination signal PSRX is inputted in synchronization with the clock signal CLK. The clock signal CLK may be inputted to the refresh control circuit 40 through a pad P5.

The memory circuit 50 may perform a power-down operation and a refresh operation in response to the power-down signal PDE and the refresh signal SREF. The memory circuit 50 may perform the power-down operation if the power-down signal PDE is enabled. The memory circuit 50 may perform the refresh operation if the refresh signal SREF is enabled. During the power-down operation, the semiconductor device may stop performing an input/output (I/O) operation of data and generating internal voltages for driving internal circuits of the semiconductor devices. The refresh operation may correspond to an operation for rewriting data stored in memory cells into the memory cells within a data retention time. The refresh operation may be set to a self-refresh operation, an auto-refresh operation or the like according to the embodiments.

Various combinations of the commands CMD<1:N> for the power-down operation of the semiconductor device will be described hereinafter with reference to FIG. 2 in conjunction with an example in which the commands CMD<1:N> are set to have five bits.

A combination of the commands CMD<1:5> for power-down operation entry may be set to include a first command<1> having a logic "high" level, a second command<2> having a logic "low" level, a third command<3> having a logic "high" level, a fourth command<4> having a logic "high" level, and a fifth command<5> having a logic "high" level. In addition, the operation selection signal TLCA for the power-down operation entry may be set to have a logic "low" level.

A combination of the commands CMD<1:5> for power-down operation exit may be set to include a first command<1> having a logic "high" level, a second command<2> having a logic "high" level, a third command<3> having a logic "high" level, a fourth command<4> having a logic "high" level, and a fifth command<5> having a logic "high" level. In addition, the operation selection signal TLCA for the power-down operation exit may be set to have a logic "low" level.

Figure 2:
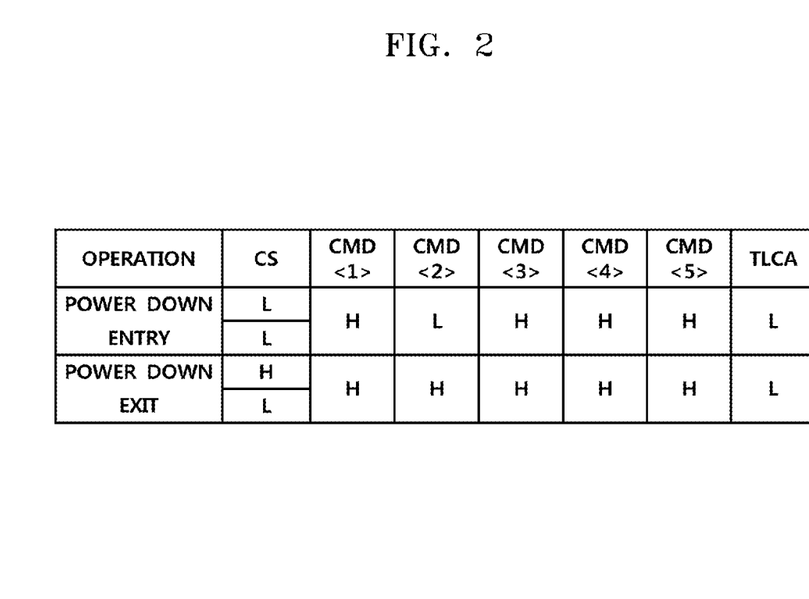
FIG. 2 is a table illustrating a power-down operation of a semiconductor device according to an embodiment.

The combinations of the commands <1:5> illustrated in FIG. 2 are merely examples of suitable combinations for the power-down operation. Accordingly, in some embodiments, any other combinations of the commands <1:5> may be used to perform and terminate the power-down operation.

Various combinations of the commands CMD<1:N> for the refresh operation of the semiconductor device will be described hereinafter with reference to FIG. 3 in conjunction with an example in which the commands CMD<1:N> are set to have five bits.

A combination of the commands CMD<1:5> for refresh operation entry may be set to include a first command<1> having a logic "high" level, a second command<2> having a logic "low" level, a third command<3> having a logic "high" level, a fourth command<4> having a logic "high" level, and a fifth command<5> having a logic "high" level. In addition, the operation selection signal TLCA for the refresh operation entry may be set to have a logic "high" level.

A combination of the commands CMD<1:5> for refresh operation exit may be set to include a first command<1> having a logic "high" level, a second command<2> having a logic "high" level, a third command<3> having a logic "high" level, a fourth command<4> having a logic "high" level, and a fifth command<5> having a logic "high" level. In addition, the operation selection signal TLCA for the refresh operation exit may be set to have a logic "high" level.

Figure 3:
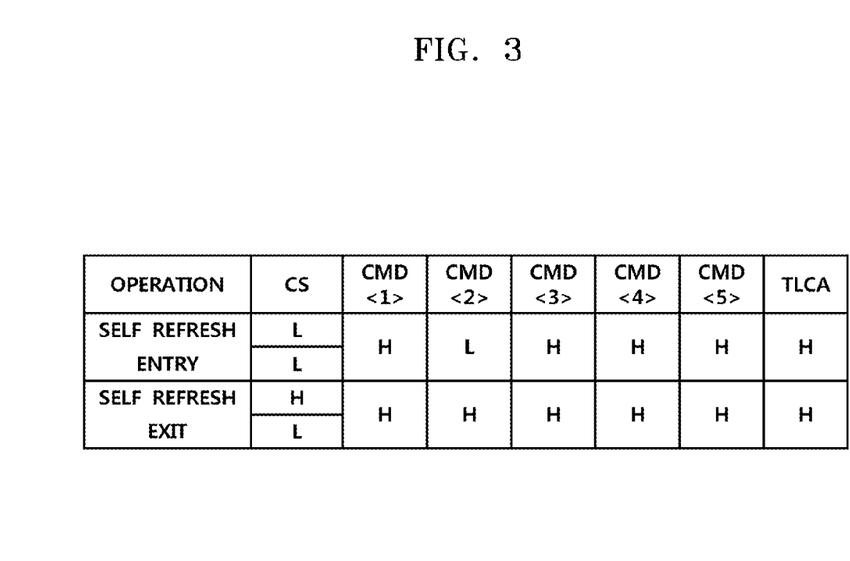
FIG. 3 is a table illustrating a refresh operation of a semiconductor device according to an embodiment.

The combinations of the commands <1:5> illustrated in FIG. 3 are merely examples of suitable combinations for the refresh operation. Accordingly, in some embodiments, any other combinations of the commands <1:5> may be used to perform and terminate the refresh operation.

Figure 4:
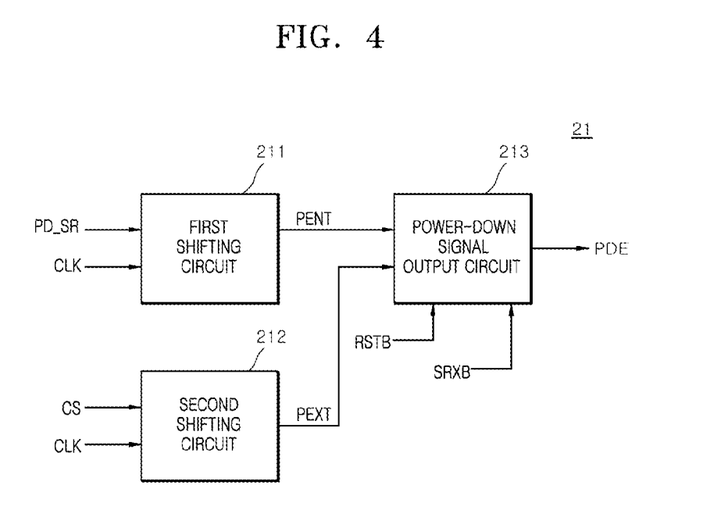
FIG. 4 is a block diagram illustrating an example of a representation of a configuration of a power-down signal generation circuit included in a semiconductor device of FIG. 1.

Referring to FIG. 4, the power-down signal generation circuit 21 may include a first shifting circuit 211, a second shifting circuit 212 and a power-down signal output circuit 213.

The first shifting circuit 211 may shift the multi-operation signal PD_SR to generate a power-down entry signal PENT in synchronization with the clock signal CLK. The first shifting circuit 211 may shift the multi-operation signal PD_SR by a predetermined number of cycle times of the clock signal CLK to generate the power-down entry signal PENT. The predetermined number of cycle times of the clock signal CLK for shifting the multi-operation signal PD_SR may be set to be different according to the embodiments. The first shifting circuit 211 may be realized using a general shift register that shifts an input signal (i.e., the multi-operation signal PD_SR) in synchronization with the clock signal CLK.

The second shifting circuit 212 may shift the chip selection signal CS to generate a power-down exit signal PEXT in synchronization with the clock signal CLK. The second shifting circuit 212 may shift the chip selection signal CS by a predetermined number of cycle times of the clock signal CLK to generate the power-down exit signal PEXT. The predetermined number of cycle times of the clock signal CLK for shifting the chip selection signal CS may be set to be different according to the embodiments. The predetermined number of cycle times of the clock signal CLK for shifting the chip selection signal CS may be set to correspond to the power-down operation period. The second shifting circuit 212 may be realized using a general shift register that shifts an input signal (i.e., the chip selection signal CS) in synchronization with the clock signal CLK.

The power-down signal output circuit 213 may generate the power-down signal PDE in response to the power-down entry signal PENT and the power-down exit signal PEXT. The power-down signal output circuit 213 may generate the power-down signal PDE which is enabled if the power-down entry signal PENT is enabled. The power-down signal output circuit 213 may generate the power-down signal PDE which is disabled if the power-down exit signal PEXT is enabled. The power-down signal output circuit 213 may generate the power-down signal PDE which is enabled in response to a reset signal RSTB which is enabled while the semiconductor device performs an initialization operation. The power-down signal output circuit 213 may generate the power-down signal PDE which is enabled if the refresh termination signal SRXB is disabled.

Figure 5:
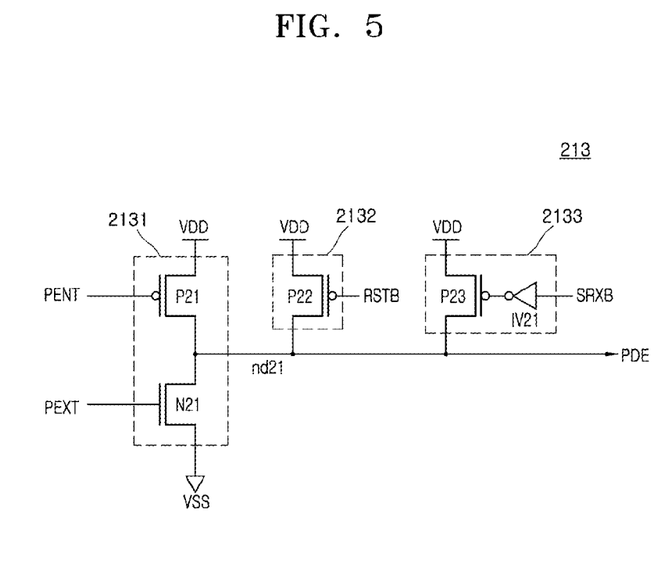
FIG. 5 is a circuit diagram illustrating an example of a representation of a power-down signal output circuit included in a power-down signal generation circuit of FIG. 4.

Referring to FIG. 5, the power-down signal output circuit 213 may include a first driving circuit 2131, a second driving circuit 2132 and a third driving circuit 2133.

The first driving circuit 2131 may be realized to include a PMOS transistor P21 and an NMOS transistor N21 which are connected in series. The PMOS transistor P21 may be coupled between a power supply voltage VDD terminal and a first node nd21 and may be turned on in response to the power-down entry signal PENT. The NMOS transistor N21 may be coupled between the first node nd21 and a ground voltage VSS terminal and may be turned on in response to the power-down exit signal PEXT. The first driving circuit 2131 may drive the first node nd21 to generate the power-down signal PDE, in response to the power-down entry signal PENT and the power-down exit signal PEXT. The first driving circuit 2131 may pull up the first node nd21 to generate the power-down signal PDE which is enabled to have a logic "high" level, if the power-down entry signal PENT is enabled to have a logic "low" level. The first driving circuit 2131 may pull down the first node nd21 to generate the power-down signal PDE which is disabled to have a logic "low" level, if the power-down exit signal PEXT is enabled to have a logic "high" level.

The second driving circuit 2132 may be realized using a PMOS transistor P22 which is coupled between the power supply voltage VDD terminal and the first node nd21. The PMOS transistor P22 may be turned on in response to the reset signal RSTB. The second driving circuit 2132 may generate the power-down signal PDE which is enabled in response to the reset signal RSTB. The second driving circuit 2132 may pull up the first node nd21 to generate the power-down signal PDE which is enabled to have a logic "high" level, if the reset signal RSTB is enabled to have a logic "low" level.

The third driving circuit 2133 may be realized to include an inverter IV21 and a PMOS transistor P23. The inverter IV21 may inversely buffer the refresh termination signal SRXB. The PMOS transistor P23 may be coupled between the power supply voltage VDD terminal and the first node nd21 and may be turned on in response to an output signal of the inverter IV21. The third driving circuit 2133 may generate the power-down signal PDE which is enabled in response to the refresh termination signal SRXB. The third driving circuit 2133 may pull up the first node nd21 to generate the power-down signal PDE which is enabled to have a logic "high" level, if the refresh termination signal SRXB is disabled to have a logic "high" level.

As described above, the power-down signal output circuit 213 may generate the power-down signal PDE in response to the power-down entry signal PENT and the power-down exit signal PEXT. The power-down signal output circuit 213 may generate the power-down signal PDE which is enabled in response to the reset signal RSTB during the initialization operation of the semiconductor device. The power-down signal output circuit 213 may generate the power-down signal PDE which is enabled in response to the refresh termination signal SRXB during the refresh operation.

A power-down operation of the semiconductor device according to an embodiment will be described hereinafter with reference to FIG. 6.

At a point of time "T1", the command decoder 10 may decode the first command CMD<1> having a logic "high" level, the second command CMD<2> having a logic "low" level, the third command CMD<3> having a logic "high" level, the fourth command CMD<4> having a logic "high" level, and the fifth command CMD<5> having a logic "high" level constituting the commands CMD<1:N> for entering the power-down operation to generate the multi-operation signal PD_SR having a logic "high" level, in response to the chip selection signal CS having a logic "low" level. The first to fifth commands CMD<1:5> may be inputted to the command decoder 10 in synchronization with a rising edge of the clock signal CLK. Meanwhile, the operation selection signal TLCA having a logic "low" level (i.e., L) may be inputted to the command decoder 10 so that the semiconductor device does not enter the refresh operation.

After the point of time "T1", a combination of the commands CMD<1:5> may change so that all of the first to fifth commands CMD<1>, CMD<2>, CMD<3>, CMD<4> and CMD<5> have a logic "high" level.

At a point of time "T2", the power-down signal generation circuit 21 may generate the power-down signal PDE which is enabled to have a logic "high" level in response to the chip selection signal CS having a logic "low" level at the point of time "T1" and the multi-operation signal PD_SR having a logic "high" level at the point of time "T1", in synchronization with a rising edge of the clock signal CLK.

The memory circuit 50 may perform the power-down operation in response to the power-down signal PDE having a logic "high" level.

At a point of time "T3", the command decoder 10 may decode the first command CMD<1> having a logic "high" level, the second command CMD<2> having a logic "high" level, the third command CMD<3> having a logic "high" level, the fourth command CMD<4> having a logic "high" level, and the fifth command CMD<5> having a logic "high" level constituting the commands CMD<1:N> for terminating the power-down operation to generate the multi-operation signal PD_SR having a logic "low" level, in response to the chip selection signal CS whose level is changed from a logic "high" level into a logic "low" level.

The power-down signal generation circuit 21 may generate the power-down signal PDE having a logic "low" level because the chip selection signal CS having a logic "low" level is inputted after the first set period from the point of time "T1" that the multi-operation signal PD_SR is enabled. The power-down operation period may correspond to the first set period.

The memory circuit 50 may terminate the power-down operation in response to the power-down signal PDE having a logic "low" level.

Figure 6:
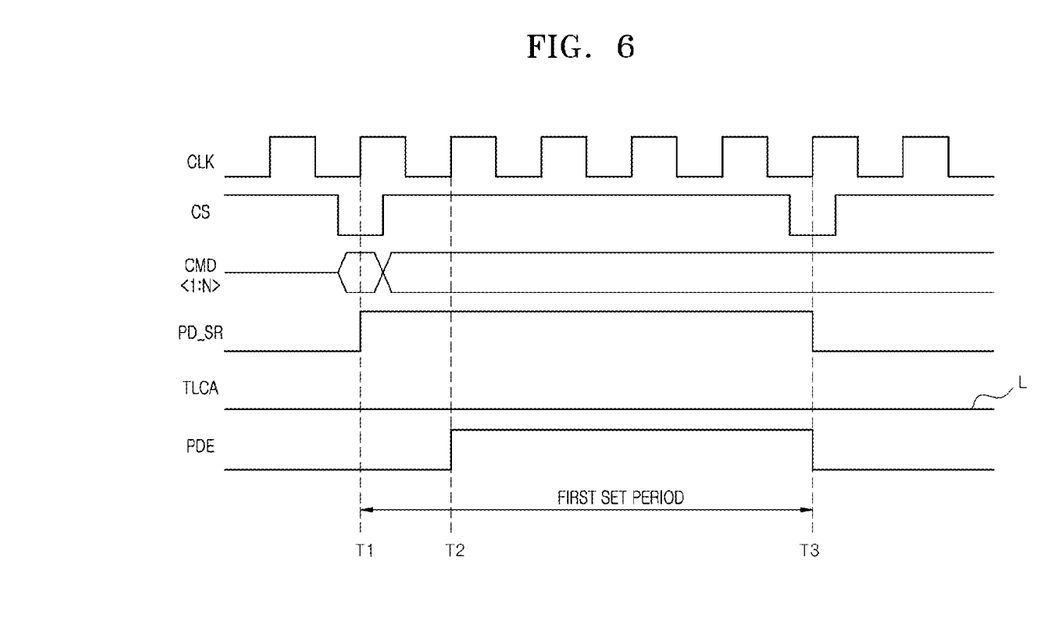
FIG. 6 is a timing diagram illustrating a power-down operation of a semiconductor device according to an embodiment.

The timing diagram illustrated in FIG. 6 is merely an example of suitable timing diagrams for the power-down operation. Accordingly, in some embodiments, any other timing diagrams may be used to perform and terminate the power-down operation.

Figure 7:
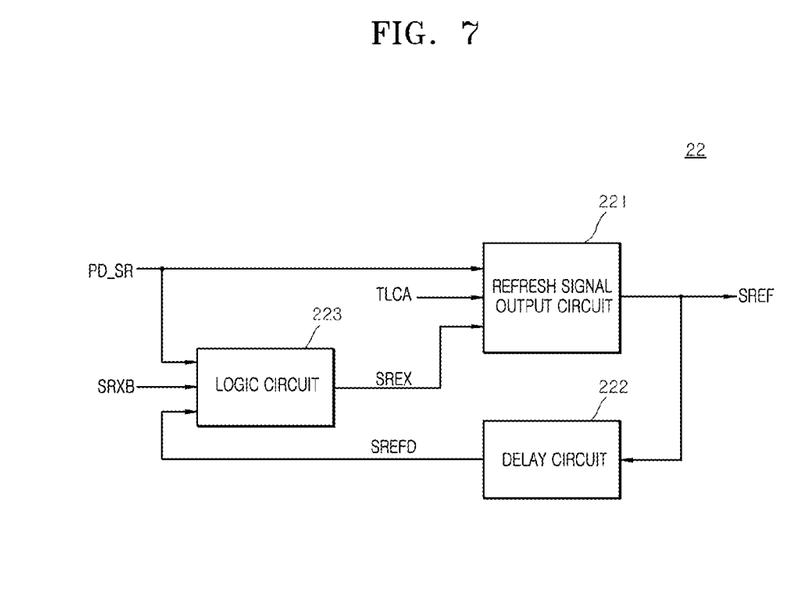
FIG. 7 is a block diagram illustrating an example of a representation of a configuration of a refresh signal generation circuit included in a semiconductor device of FIG. 1.

Referring to FIG. 7, the refresh signal generation circuit 22 may include a refresh signal output circuit 221, a delay circuit 222 and a logic circuit 223.

The refresh signal output circuit 221 may generate the refresh signal SREF which is enabled in response to the multi-operation signal PD_SR and the operation selection signal TLCA. The refresh signal output circuit 221 may generate the refresh signal SREF which is disabled in response to a refresh exit signal SREX. The refresh signal output circuit 221 may generate the refresh signal SREF which is enabled if the multi-operation signal PD_SR and the operation selection signal TLCA are enabled. The refresh signal output circuit 221 may generate the refresh signal SREF which is disabled if the refresh exit signal SREX is enabled. The refresh signal output circuit 221 may generate the refresh signal SREF which is enabled from a point of time that the multi-operation signal PD_SR and the operation selection signal TLCA are enabled till a point of time that the refresh exit signal SREX is enabled.

The delay circuit 222 may delay the refresh signal SREF by the second set period to generate a refresh delay signal SREFD. The delay circuit 222 may invert and delay the refresh signal SREF by the second set period to generate the refresh delay signal SREFD. The delay circuit 222 may be realized using a general delay circuit comprised of a plurality of inverters which are connected in series.

The logic circuit 223 may generate the refresh exit signal SREX in response to the multi-operation signal PD_SR, the refresh termination signal SRXB and the refresh delay signal SREFD. The logic circuit 223 may generate the refresh exit signal SREX which is disabled if the multi-operation signal PD_SR is enabled. The logic circuit 223 may generate the refresh exit signal SREX which is disabled if the refresh termination signal SRXB is disabled. The logic circuit 223 may generate the refresh exit signal SREX which is disabled if the refresh delay signal SREFD is disabled. The logic circuit 223 may execute a NOR operation of the multi-operation signal PD_SR, the refresh termination signal SRXB and the refresh delay signal SREFD to generate the refresh exit signal SREX. The logic circuit may be comprised of a logic circuit 223 or circuits to implement the NOR operation. For example, the logic circuit 223 may be realized with a NOR gate or equivalent circuits for performing a NOR operation.

As described above, the refresh signal generation circuit 22 may generate the refresh signal SREF which is enabled during the refresh operation period in response to the multi-operation signal PD_SR and the operation selection signal TLCA.

Figure 8:
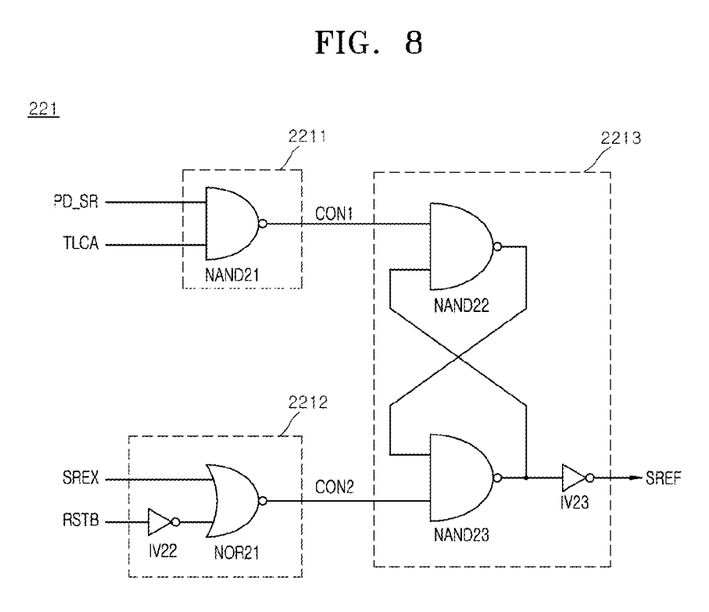
FIG. 8 is a circuit diagram illustrating an example of a representation of a refresh signal output circuit included in a refresh signal generation circuit of FIG. 7.

Referring to FIG. 8, the refresh signal output circuit 221 may include a first control signal generation circuit 2211, a second control signal generation circuit 2212 and a latch circuit 2213.

The first control signal generation circuit 2211 may be realized using a NAND gate NAND21 and may be configured to generate a first control signal CON1 in response to the multi-operation signal PD_SR and the operation selection signal TLCA. The first control signal generation circuit 2211 may execute a NAND operation of the multi-operation signal PD_SR and the operation selection signal TLCA to generate the first control signal CON1. The first control signal generation circuit 2211 may generate the first control signal CON1 which is enabled to have a logic "low" level if both of the multi-operation signal PD_SR and the operation selection signal TLCA are enabled to have a logic "high" level.

The second control signal generation circuit 2212 may be realized to include an inverter IV22 and a NOR gate NOR21 and may be configured to generate a second control signal CON2 in response to the reset signal RSTB or the refresh exit signal SREX. The second control signal generation circuit 2212 may generate the second control signal CON2 which is enabled to have a logic "low" level if the reset signal RSTB is enabled to have a logic "low" level. The second control signal generation circuit 2212 may generate the second control signal CON2 which is enabled to have a logic "low" level if the refresh exit signal SREX is enabled to have a logic "high" level.

The latch circuit 2213 may be realized to include NAND gates NAND22 and NAND23 and an inverter IV23 and may be configured to generate the refresh signal SREF which is enabled in response to the first control signal CON1 and which is disabled in response to the second control signal CON2. The latch circuit 2213 may generate the refresh signal SREF which is enabled to have a logic "high" level if the first control signal CON1 is enabled to have a logic "low" level. The latch circuit 2213 may generate the refresh signal SREF which is disabled to have a logic "low" level if the second control signal CON2 is enabled to have a logic "low" level. The latch circuit 2213 may generate the refresh signal SREF which is enabled to have a logic "high" level from a point of time that the first control signal CON1 is enabled to have a logic "low" level till a point of time that the second control signal CON2 is enabled to have a logic "low" level.

As described above, the refresh signal output circuit 221 may generate the refresh signal SREF which is enabled in response to the multi-operation signal PD_SR and the operation selection signal TLCA and which is disabled in response to the reset signal RSTB or the refresh exit signal SREX.

Figure 9:
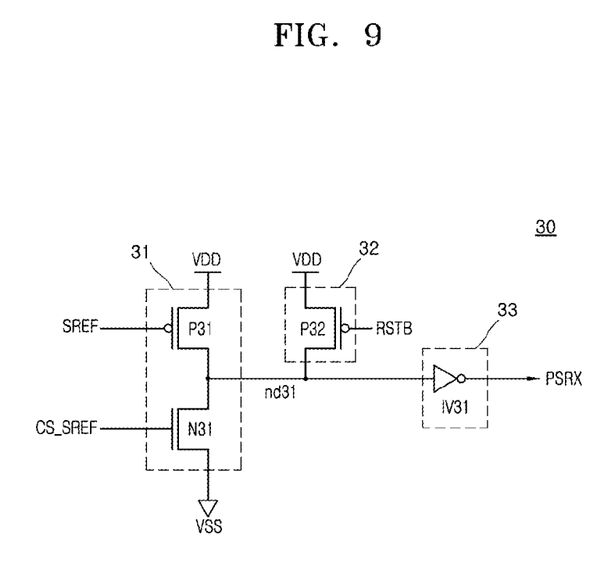
FIG. 9 is a circuit diagram illustrating an example of a representation of a termination signal generation circuit included in a semiconductor device of FIG. 1.

Referring to FIG. 9, the termination signal generation circuit 30 may include a fourth driving circuit 31, a fifth driving circuit 32 and a buffer circuit 33.

The fourth driving circuit 31 may be realized to include a PMOS transistor P31 and an NMOS transistor N31 which are connected in series. The PMOS transistor P31 may be coupled between the power supply voltage VDD terminal and a second node nd31 and may be turned on in response to the refresh signal SREF. The NMOS transistor N31 may be coupled between the second node nd31 and the ground voltage VSS terminal and may be turned on in response to the refresh control signal CS_SREF. The fourth driving circuit 31 may drive the second node nd31 in response to the refresh signal SREF and the refresh control signal CS_SREF. The fourth driving circuit 31 may pull up the second node nd31 if the refresh signal SREF is disabled to have a logic "low" level. The fourth driving circuit 31 may pull down the second node nd31 if the refresh control signal CS_SREF is enabled to have a logic "high" level.

The fifth driving circuit 32 may be realized using a PMOS transistor P32 which is coupled between the power supply voltage VDD terminal and the second node nd31. The PMOS transistor P32 may be turned on in response to the reset signal RSTB. The fifth driving circuit 32 may pull up the second node nd31 in response to the reset signal RSTB.

The buffer circuit 33 may be realized using an inverter IV31 and may be configured to inversely buffer a signal of the second node nd31 to generate the termination signal PSRX.

As described above, the termination signal generation circuit 30 may generate the termination signal PSRX which is disabled before the refresh operation and during the initialization operation and which is enabled if the refresh control signal CS_SREF is inputted.

The refresh operation of the semiconductor device according to an embodiment will be described hereinafter with reference to FIG. 10.

At a point of time "T11", the command decoder 10 may decode the first command CMD<1> having a logic "high" level, the second command CMD<2> having a logic "low" level, the third command CMD<3> having a logic "high" level, the fourth command CMD<4> having a logic "high" level, and the fifth command CMD<5> having a logic "high" level constituting the commands CMD<1:N> for entering the refresh operation to generate the multi-operation signal PD_SR having a logic "high" level, in response to the chip selection signal CS having a logic "low" level. The first to fifth commands CMD<1:5> may be inputted to the command decoder 10 in synchronization with a rising edge of the clock signal CLK. Meanwhile, the operation selection signal TLCA having a logic "high" level may be inputted to the command decoder 10 so that the semiconductor device enters the refresh operation.

After the point of time "T11", a combination of the commands CMD<1:5> may change so that all of the first to fifth commands CMD<1>, CMD<2>, CMD<3>, CMD<4> and CMD<5> have a logic "high" level.

At a point of time "T12", the refresh signal generation circuit 22 may generate the refresh signal SREF which is enabled to have a logic "high" level in response to the operation selection signal TLCA having a logic "high" level at the point of time "T11" and the multi-operation signal PD_SR having a logic "high" level at the point of time "T11". The clock signal CLK is not toggled if the refresh signal SREF for the refresh operation is enabled.

The memory circuit 50 may perform the refresh operation in response to the refresh signal SREF having a logic "high" level.

At a point of time "T13", a level of the chip selection signal CS may be changed from a logic "high" level into a logic "low" level to terminate the refresh operation. The chip selection signal CS may maintain a logic "low" level from the point of time "T13". A period in which the chip selection signal CS maintains a logic "low" level may correspond to a period for terminating the refresh operation. If a level of the chip selection signal CS is changed from a logic "high" level into a logic "low" level at the point of time "T13", the clock signal CLK may be toggled. Although FIG. 10 illustrates an example in which the period having a logic "low" level of the chip selection signal CS to terminate the refresh operation corresponds to a single cycle time of the clock signal CLK, the present disclosure is not limited thereto. That is, the period having a logic "low" level of the chip selection signal CS to terminate the refresh operation may be set to be different according to the embodiments. The period having a logic "low" level of the chip selection signal CS to terminate the refresh operation may be set to provide a stable toggle of the clock signal CLK.

At a point of time "T14", the command decoder 10 may decode the first command CMD<1> having a logic "high" level, the second command CMD<2> having a logic "high" level, the third command CMD<3> having a logic "high" level, the fourth command CMD<4> having a logic "high" level, and the fifth command CMD<5> having a logic "high" level constituting the commands CMD<1:N> for terminating the refresh operation to generate the multi-operation signal PD_SR having a logic "low" level, in response to the chip selection signal CS whose level is changed from a logic "high" level into a logic "low" level at the point of time "T13".

The refresh signal generation circuit 22 may generate the refresh signal SREF having a logic "low" level after the second set period corresponding to the refresh operation period from the point of time "T11" that the multi-operation signal PD_SR is enabled. The refresh operation period may be set to correspond to the second set period.

The memory circuit 50 may terminate the refresh operation in response to the refresh signal SREF having a logic "low" level.

Figure 10:
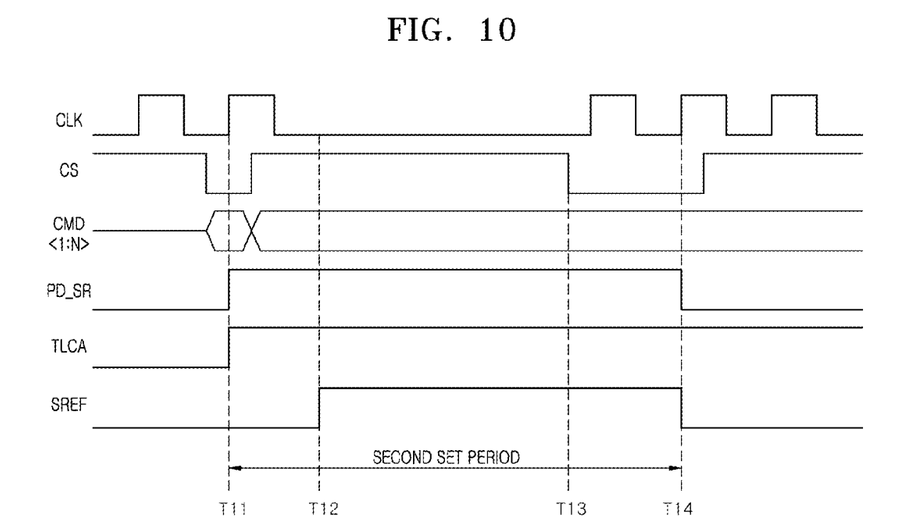
FIG. 10 is a timing diagram illustrating an example of a representation of a refresh operation of a semiconductor device according to an embodiment.

The timing diagram illustrated in FIG. 10 is merely an example of suitable timing diagrams for the refresh operation. Accordingly, in some embodiments, any other timing diagrams may be used to perform and terminate the refresh operation.

An operation of the semiconductor device having an aforementioned configuration will be described hereinafter in conjunction with an example in which the refresh operation starts during the power-down operation and terminates after the power-down operation.

The command decoder 10 may decode the commands CMD<1:N> to generate the multi-operation signal PD_SR is enabled to have a logic "high" level, in response to the chip selection signal CS.

The first shifting circuit 211 of the power-down signal generation circuit 21 may shift the multi-operation signal PD_SR in synchronization with the clock CLK to generate the power-down entry signal PENT which is enabled to have a logic "low" level.

The power-down signal output circuit 213 of the power-down signal generation circuit 21 may generate the power-down signal PDE having a logic "high" level in response to the power-down entry signal PENT having a logic "low" level.

The memory circuit 50 may perform the power-down operation in response to the power-down signal PDE having a logic "high" level.

The refresh signal output circuit 221 of the refresh signal generation circuit 22 may generate the refresh signal SREF which is enabled to have a logic "high" level in response to the multi-operation signal PD_SR having a logic "high" level and the operation selection signal TLCA having a logic "high" level.

The memory circuit 50 may perform the refresh operation in response to the refresh signal SREF having a logic "high" level.

The second shifting circuit 212 of the power-down signal generation circuit 21 may shift the chip selection signal CS by the first set period corresponding to the power-down operation period to generate the power-down exit signal PEXT having a logic "high" level.

The power-down signal output circuit 213 of the power-down signal generation circuit 21 may generate the power-down signal PDE having a logic "low" level in response to the power-down exit signal PEXT having a logic "high" level.

In such a case, the refresh control signal CS_SREF having a logic "high" level may be inputted to the termination signal generation circuit 30 to terminate the refresh operation.

The termination signal generation circuit 30 may generate the termination signal PSRX which is enabled to have a logic "high" level in response to the refresh control signal CS_SREF having a logic "high" level.

The refresh control circuit 40 may generate the refresh termination signal SRXB which is enabled to have a logic "low" level in response to the termination signal PSRX having a logic "high" level, in synchronization with the clock signal CLK.

The memory circuit 50 may terminate the power-down operation in response to the power-down signal PDE having a logic "low" level.

The delay circuit 222 of the refresh signal generation circuit 22 may delay the refresh signal SREF by the second set period to generate the refresh delay signal SREFD having a logic "low" level.

The logic circuit 223 of the refresh signal generation circuit 22 may generate the refresh exit signal SREX having a logic "high" level in response to the power-down signal PDE having a logic "low" level, the refresh termination signal SRXB having a logic "low" level, and the refresh delay signal SREFD having a logic "low" level.

The refresh signal output circuit 221 of the refresh signal generation circuit 22 may generate the refresh signal SREF which is disabled to have a logic "low" level in response to the refresh exit signal SREX having a logic "high" level.

The memory circuit 50 may terminate the refresh operation in response to the refresh signal SREF having a logic "low" level.

The semiconductor device having an aforementioned configuration may internally perform a power-down operation and a refresh operation according to a multi-operation signal and an operation selection signal which are generated from commands without any external signal for controlling the power-down operation and the refresh operation.

Figure 11:
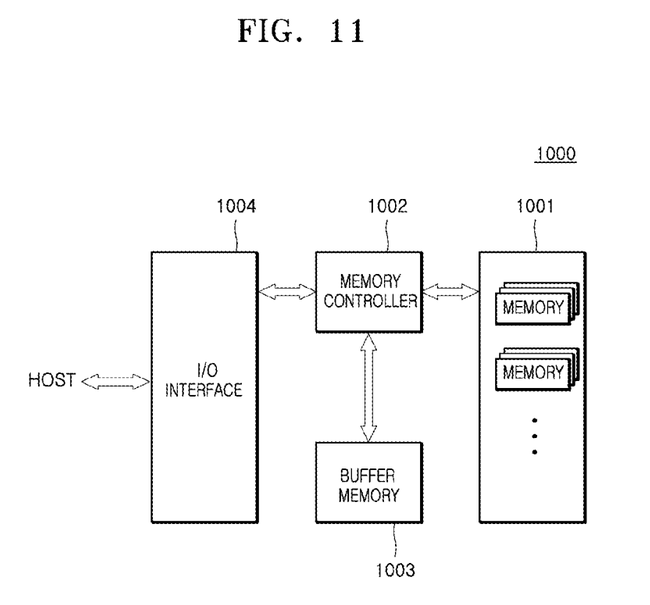
FIG. 11 is a block diagram illustrating an example of a representation of a configuration of an electronic system employing the semiconductor device illustrated in FIGS. 1 to 10.

The semiconductor devices described with reference to FIGS. 1 to 10 may be applied to an electronic system that includes a memory system, a graphic system, a computing system, a mobile system, or the like. For example, as illustrated in FIG. 11, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1. The data storage circuit 1001 may generate internal data having a logic level which is internally set regardless of logic levels of external data and may perform an initialization operation that stores the internal data in a memory cell array included in the data storage circuit 1001. The data storage circuit 1001 may include an On Die Termination (ODT) circuit (not illustrated) for preventing distortion of data. The ODT circuit may be designed not to operate during the initialization operation of the data storage circuit 1001. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a power-down signal generation circuit configured to generate a power-down signal which is enabled during a power-down operation period based on a multi-operation signal that is generated by decoding commands; and
    a refresh signal generation circuit configured to generate a refresh signal which is enabled during a refresh operation period based on the multi-operation signal and an operation selection signal,
    wherein the power-down signal is enabled in response to a refresh termination signal indicating that the refresh operation period terminates.

2. The semiconductor device of claim 1, wherein the operation selection signal is inputted through a pad to which the commands are applied and is a signal for performing the refresh operation.

3. The semiconductor device of claim 1, wherein the refresh signal is disabled if a refresh termination signal is inputted after the power-down operation period.

4. The semiconductor device of claim 1, wherein the power-down signal generation circuit includes:
    a first shifting circuit configured to shift the multi-operation signal in synchronization with a clock signal to generate a power-down entry signal;
    a second shifting circuit configured to shift a chip selection signal in synchronization with the clock signal to generate a power-down exit signal; and
    a power-down signal output circuit configured to generate the power-down signal which is disabled based on a reset signal or a refresh termination signal and which is enabled from a point of time that the power-down entry signal is inputted till a point of time that the power-down exit signal is inputted.

5. The semiconductor device of claim 4, wherein the power-down signal output circuit includes:
    a first driving circuit configured to drive a first node to generate the power-down signal based on the power-down entry signal and the power-down exit signal;
    a second driving circuit configured to drive the first node to initialize the power-down signal based on the reset signal; and
    a third driving circuit configured to drive the first node to initialize the power-down signal based on the refresh termination signal.

6. The semiconductor device of claim 1, wherein the refresh signal generation circuit includes:
    a refresh signal output circuit configured to generate the refresh signal which is enabled based on the multi-operation signal and the operation selection signal and which is disabled based on a refresh exit signal;
    a delay circuit configured to delay the refresh signal by a set period to generate a refresh delay signal; and
    a logic circuit configured to generate the refresh exit signal which is enabled if the multi-operation signal is enabled and the refresh delay signal or a refresh termination signal is inputted.

7. The semiconductor device of claim 6, wherein the refresh signal output circuit includes:
    a first control signal generation circuit configured to generate a first control signal which is enabled based on the multi-operation signal and the operation selection signal;
    a second control signal generation circuit configured to generate a second control signal which is enabled based on a reset signal or the refresh exit signal; and
    a latch circuit configured to generate the refresh signal which is enabled based on the first control signal and which is disabled based on the second control signal.

8. The semiconductor device of claim 1, further comprising:
    a termination signal generation circuit configured to generate a termination signal which is enabled based on the refresh signal and a refresh control signal; and
    a refresh control circuit configured to generate a refresh termination signal which is enabled based on the termination signal in synchronization with a clock signal.

9. The semiconductor device of claim 8, wherein the termination signal generation circuit includes:
    a fourth driving circuit configured to pull up a second node in response the refresh signal and configured to pull down the second node in response the refresh control signal;
    a fifth driving circuit configured to pull up the second node based on a reset signal; and
    a buffer circuit configured to inversely buffer a signal of the second node to generate the termination signal.

10. A semiconductor device comprising:
    an operation signal generation circuit configured to generate a power-down signal which is enabled during a power-down operation period and a refresh signal which is enabled during a refresh operation period, based on a multi-operation signal and an operation selection signal, wherein the multi-operation signal is generated by decoding commands based on a chip selection signal; and a termination signal generation circuit configured to generate a termination signal which is enabled based on the refresh signal and a refresh control signal, wherein the power-down signal is enabled in response to a refresh termination signal indicating that the refresh operation period terminates.

11. The semiconductor device of claim 10, wherein the operation selection signal is inputted through a pad to which the commands are applied and is a signal for performing the refresh operation.

12. The semiconductor device of claim 10, wherein the refresh signal is disabled if a refresh termination signal is inputted after the power-down operation period.

13. The semiconductor device of claim 10, wherein the operation signal generation circuit includes:

a power-down signal generation circuit configured to generate the power-down signal which is enabled based on the multi-operation signal; and a refresh signal generation circuit configured to generate the refresh signal which is enabled based on the multi-operation signal and the operation selection signal.

14. The semiconductor device of claim 13, wherein the power-down signal generation circuit includes:

a first shifting circuit configured to shift the multi-operation signal in synchronization with a clock signal to generate a power-down entry signal;

a second shifting circuit configured to shift the chip selection signal in synchronization with the clock signal to generate a power-down exit signal; and a power-down signal output circuit configured to generate the power-down signal which is disabled based on a reset signal or a refresh termination signal and which is enabled from a point of time that the power-down entry signal is inputted till a point of time that the power-down exit signal is inputted.

15. The semiconductor device of claim 14, wherein the power-down signal output circuit includes:

a first driving circuit configured to drive a first node to generate the power-down signal based on the power-down entry signal and the power-down exit signal;

a second driving circuit configured to drive the first node to initialize the power-down signal based on the reset signal; and a third driving circuit configured to drive the first node to initialize the power-down signal based on the refresh termination signal.

16. The semiconductor device of claim 13, wherein the refresh signal generation circuit includes:

a refresh signal output circuit configured to generate the refresh signal which is enabled based on the multi-operation signal and the operation selection signal and which is disabled based on a refresh exit signal;

a delay circuit configured to delay the refresh signal by a set period to generate a refresh delay signal; and a logic circuit configured to generate the refresh exit signal which is enabled if the multi-operation signal is enabled and the refresh delay signal or a refresh termination signal is inputted.

17. The semiconductor device of claim 16, wherein the refresh signal output circuit includes:

a first control signal generation circuit configured to generate a first control signal which is enabled based on the multi-operation signal and the operation selection signal;

a second control signal generation circuit configured to generate a second control signal which is enabled based on a reset signal or the refresh exit signal; and a latch circuit configured to generate the refresh signal which is enabled based on the first control signal and which is disabled based on the second control signal.

18. The semiconductor device of claim 10, wherein the termination signal generation circuit includes:

a fourth driving circuit configured to pull up a second node in response the refresh signal and configured to pull down the second node in response the refresh control signal;

a fifth driving circuit configured to pull up the second node based on a reset signal; and a buffer circuit configured to inversely buffer a signal of the second node to generate the termination signal.

19. The semiconductor device of claim 12, further comprising a refresh control circuit configured to generate the refresh termination signal which is enabled based on the termination signal in synchronization with a clock signal.

20. The semiconductor device of claim 10, further comprising a memory circuit configured to enter the power-down operation period based on the power-down signal and configured to enter the refresh operation period based on the refresh signal.

* * * * *